(12) United States Patent
Lam et al.

(10) Patent No.: US 7,706,851 B2
(45) Date of Patent: Apr. 27, 2010

(54) COMPANDER, AND ASSOCIATED METHODOLOGY, FOR A RADIO COMMUNICATION STATION OPERABLE PURSUANT TO A CODED SQUELCH SCHEME

(75) Inventors: Man Lung Lam, Hong Kong (HK);
Man Tai Vincent Lam, Hong Kong (HK)

(73) Assignee: Radioshack Corporation, Fort Worth, TX (US)

( * ) Notice: Subject to any disclaimer, the term of this patent is extended or adjusted under 35 U.S.C. 154(b) by 1158 days.

(21) Appl. No.: 11/186,266

(22) Filed: Jul. 21, 2005

(65) Prior Publication Data
US 2007/0019678 A1    Jan. 25, 2007

(51) Int. Cl.
*H04B 1/10* (2006.01)
*H04B 7/00* (2006.01)

(52) U.S. Cl. .................. 455/701; 455/72; 455/218; 455/212; 455/702

(58) Field of Classification Search .......... 455/72, 455/218, 701, 702, 202, 212
See application file for complete search history.

(56) References Cited

U.S. PATENT DOCUMENTS

| | | |
|---|---|---|
| 4,103,239 A | 7/1978 | Meewezen |
| 4,376,916 A | 3/1983 | Glaberson |
| 4,541,118 A | 9/1985 | Eastmond et al. |
| 4,839,906 A | 6/1989 | Leveque et al. |
| 4,907,217 A | 3/1990 | Leveque |
| 5,065,451 A | 11/1991 | Leveque |
| 5,255,325 A | 10/1993 | Ishimitsu et al. |
| 5,396,562 A | 3/1995 | Ishimitsu et al. |
| 5,633,939 A | 5/1997 | Kitani et al. |
| 5,745,523 A | 4/1998 | Dent et al. |
| 5,892,834 A | 4/1999 | Smart et al. |
| 6,006,108 A | 12/1999 | Black et al. |
| 6,052,565 A * | 4/2000 | Ishikura et al. .......... 455/67.11 |
| 6,107,879 A | 8/2000 | Hoshino et al. |
| 6,351,653 B1 * | 2/2002 | Alberth et al. ........... 455/552.1 |
| 6,366,622 B1 | 4/2002 | Brown et al. |
| 2003/0224734 A1 * | 12/2003 | Takekawa et al. ............. 455/72 |
| 2006/0217166 A1 * | 9/2006 | Swanson .................... 455/701 |

OTHER PUBLICATIONS

"Analog Radio Baseband Processor with RF Synthesisers, System Clocks & Auxiliary ADCs & DACs", Product Preview CMX7031—The Two-Way Radio Processor CML Microcircuits, pp. 1-6. Oct. 2005.

* cited by examiner

Primary Examiner—Tuan A Pham

(57) ABSTRACT

Apparatus, and an associated method, for companding communication data. Companding is provided for a two-way radio communication station operable pursuant to a coded squelch scheme, such as an MURS or FRS radio. A baseband processor invokes compression operations upon originating communication data that is originated at the communication station. And, the processor invokes operation of expansion operations when the communication data comprises terminating data.

18 Claims, 3 Drawing Sheets

COMPANDER, AND ASSOCIATED METHODOLOGY, FOR A RADIO COMMUNICATION STATION OPERABLE PURSUANT TO A CODED SQUELCH SCHEME

The present invention relates generally to a manner by which to operate upon communication data at a radio communication station that operates pursuant to a coded squelch scheme. More particularly, the present invention relates to apparatus, and an associated method, by which to compand data originated at, or terminated at, the radio communication station.

The data is companded at a baseband part of the radio communication station, and companding, either expansion or contraction, as appropriate, of the communication data is carried out by invoking execution of expansion or compression operations at a baseband processor of the radio communication system. By providing companding of the communication data at the baseband processor, filters that are typically required to filter electrical noise generated during operation of a conventional compander are not needed. Radio circuitry size and cost is thereby reduced relative to conventional companders.

BACKGROUND OF THE INVENTION

The use of communication systems through which to communication voice, and other, data is pervasive in modern society. For many, ready access to a communication system that provides for communications between users positioned at spaced-apart locations is a necessary aspect of many activities.

A communication system includes, at a minimum, a set of communication stations that are interconnected by way of the communication channel. At least one of the communication stations forms a sending station that sends the voice, or other communication, data to at least one other communication station that forms a receiving station. Communication systems of various constructions and capabilities have been developed and made available for popular usage.

A radio communication system is an exemplary type of communication system and is constructed to make use of radio channels. That is to say, in a radio communication system, the communication stations are interconnected by way of radio channels rather than channels defined upon wireline connections that extend between communication stations of a wireline communication system. Because fixed connections between the communication stations are not required in a radio communication system, communication stations of a radio communication system are positionable at locations at which wireline connections are not available while still providing for communications with other communication stations. Also, a radio communication system is amenable for implementation as a mobile communication system in which one or more of the communication stations of the set of communication stations is provided with communication mobility.

Some communication systems include fixed network infrastructures through which communication stations communicate the voice, or other communication, data. In other radio communication systems, communications are directly effectuated between the communication stations. In such communication systems, communications are effectuated free of routing by way of a communication network infrastructure. That is to say, some communication systems are infrastructure-free.

The radio channels used in a radio communication system are defined upon portions of the electromagnetic spectrum. Regulatory bodies have allocated various frequency bands of the electromagnetic spectrum for various types of communication systems. And, amongst the frequency band allocations are portions of the electromagnetic spectrum reserved for unlicensed access to users to utilize portions of the such frequency bands upon which to communicate.

In the United States, for instance, frequency bands defined at 151 and 154 MHz are made available for use pursuant to private, two-way, short-distance voice or other data communication services for the general public. The communication service for which these channels are defined is referred to as a MURS (Multi-User Radio Service). MURS communication stations are commercially available, typically constructed to be of dimensions and weights permitting their hand carriage by users. Sets of MURS communication stations are regularly utilized to communicate voice, and other, data therebetween. Because the channels are unlicensed, communications thereon are essentially unregulated. MURS communication stations utilize a mechanism by which a set of communication stations that are to be parties to a communication service or session identify themselves so that communications are carried out between the appropriate MURS communication stations.

Namely, coded squelch schemes are utilized by MURS communication stations by which to identify the respective communication stations and to facilitate communications between which the communications are to be carried out. In one conventional scheme, a continuous tone coded squelch system (CTCSS) scheme is utilized. And, in another conventional scheme, a digital coded squelch (DCS) scheme is utilized.

Another frequency band, located at 460 MHz is also allocated in the United States for unlicensed communications. Family Radio Service (FRS) communications are effectuated upon channels within this frequency band. That is to say, radio communications between FRS communication stations are carried out upon radio channels within the allocated band at the 460 MHz band. Analogous to the coded squelch schemes utilized in MURS communications, coded squelch schemes are also utilized pursuant to FRS communications.

Additionally, other types of short range, radio communication services and radio communication stations for carrying out such services, are available and utilized. Such additional radio communication services utilize, e.g., the aforementioned frequency bands, or others.

Many of the MURS and FRS communication stations include companders that operate, alternately, to compress communication data that is to be sent by a communication station and expand communication data terminating at the communication station. Companders utilized in conventional MURS and FRS communication stations are typically hardware-implemented at the baseband part of the communication station. While the conventional, hardware-implemented companders are effective in their operation, noise energy is generated as a byproduct of their operation. Filtering is required of the compressed, or expanded, values generated during their operation to remove the noise energy. The need to utilize the filters increases the circuitry size required of the circuitry of the communication station as well as increases the part count of the circuitry.

While software-implemented companders are sometimes utilized for other radio communication devices, such devices have not generally been utilized in conjunction with communication stations that utilize a coded squelch scheme, such as used in MURS and FRS communication stations.

If an improved compander could be provided for communication stations operable pursuant to coded squelch system schemes, problems associated with companders conventionally utilized in such communication stations would be avoided.

It is in light of this background information related to radio communication stations that the significant improvements of the present invention have evolved.

SUMMARY OF THE INVENTION

The present invention, accordingly, advantageously provides apparatus, and an associated method, by which to operate upon communication data at a radio communication station that operates pursuant to a coded squelch scheme.

Through operation of an embodiment of the present invention, a manner is provided by which to compand data originated at, or terminated at, the radio communication system.

The radio communication station includes a baseband part, and companding performed during operation of the radio communication station is performed at the baseband part of the communication station. The companding operations, either expansion or compression operations, as appropriate, are carried out by invoking execution of expansion or compression operations at a baseband processor of the radio communication system.

By providing companding of the communication data at the baseband processor, filters that are generally required to be positioned to filter companded data generated by conventional hardware companders are obviated. Such filters, of relatively large circuit sizes, the dimensional requirements of the radio circuitries of the radio communication stations that are operable pursuant to an embodiment of the present invention are correspondingly reduced. Additionally, improved design flexibility of the radio circuitries are provided as the parameters of operation of companders formed pursuant to an embodiment of the present invention are more easily altered as contrasted to conventional compander devices.

In another aspect of the present invention, a processor is embodied at the baseband portion of the radio communication station. When data is originated at the radio communication system, or elsewhere, the data is applied to the processor. Detection is made at the processor of the application of the originating data thereto. And, in response to the detection, the data processor invokes compression operations to compress the originating data into compressed form. Once compressed, the originating data is provided to other radio circuitry elements, such as a modulator element that operates to modulate the originating data, once compressed, into modulated form. Thereafter, the originating data is up-mixed in frequency and operated upon at a radio part of the radio circuitry.

In another aspect of the present invention, when data is terminated at the radio communication station, i.e., originated elsewhere and sent to the radio communication station, the data is operated upon at the radio communication station, and, e.g., demodulated, and then applied to the processor embodied at the baseband part of the radio communication station. Detection is made at the processor of the application of the terminating data. And, responsive to the detection, the processor invokes performance of expansion operations to expand the terminating data. Once expanded, the terminating data is provided to other radio circuitry elements for additional operations to be performed thereon.

The detection of the originating or terminating data applied to the processor is detected, e.g., by invocation of a detection application, such as an interrupt routine. Thereby, the data, upon application to the processor is quickly operated upon, with little delay. Because the companding operations are carried out at a baseband processor rather than by a conventional, fixed compander, noise energy generated as a byproduct of the operation of such a conventional compander is not generated. And, filters otherwise required to filter out, and otherwise compensate for, the generation of the noise energy are also not required.

In one implementation, the radio communication station forms a family radio service (FRS) radio that operates pursuant to a coded squelch scheme. A baseband processor is embodied at the baseband part of the FRS radio and is adapted to receive both data originated at the FRS radio and data terminated at the FRS radio. A detector at the processor, or elsewhere, detects the application of the data to the processor, and the processor invokes companding operations as appropriate, to compand the data that is applied thereto. Originating data at the FRS radio is compressed, and terminating data is expanded.

In another implementation, the radio communication forms an MURS (Multi-User Radio Service) radio that has a baseband processor embodied at the baseband part of the radio circuitry of the MURS radio. When communication data, either originating data or terminating data, is applied to the baseband processor, a detector invokes operation of the processor to compand the data. Originating data is compressed, and terminating data is expanded. Once companding operations have been completed, the data is provided to other circuit elements of the MURS radio for further operations to be performed thereon.

In other implementations, the radio communication station is formed of other types of devices, such as a PMR, a short range radio, or a multi-mode radio. For example, the radio communication station forms a multi-mode FRS and MURS radio. The radio is operable ultimately in an FRS mode and in an MURS mode. When the originating data that is to be communicated pursuant to either of the operating modes of the radio is applied to the baseband processor, the baseband processor operates to invoke companding operations at the processor to compress the data that is to be communicated. Separate types of companding operations, in one implementation, are performed, depending upon in which of the modes of operation that the radio is operated. Analogously, when terminating data is terminated at the multi-mode radio, the terminating data is applied to the baseband processor whereat companding operations are performed thereon to expand the data applied thereto. Again, in one implementation, the companding is performed in different manners responsive to in which of the modes that the radio is operated. And, even when the radio communication station is operable in only a single mode of operation, the companding is performable, in one implementation, in a selected one of more than one companding manners.

In these and other aspects, therefore, apparatus, and associated method, and a computer program product is provided for a two-way radio communication station that operates pursuant to a coded squelch system to initiate communication of data. A processor is embodied at the radio communication station. A detector is executable at the processor for detecting presence of the communication data pursuant to operation of the radio communication station. An invoker is executable at the processor responsive to detection by the detector of the communication data. The invoker invokes compression of the communication data when the communication data comprises originating data to be sent by the radio communication station. And, the invoker invokes expansion of the communication data when the communication data comprises terminating data.

A more complete appreciation of the present invention and the scope thereof can be obtained from the accompanying drawings that are briefly summarized below, the following detailed description of the presently-preferred embodiments of the present invention, and the appended claims.

DETAILED DESCRIPTION

Figure 1:
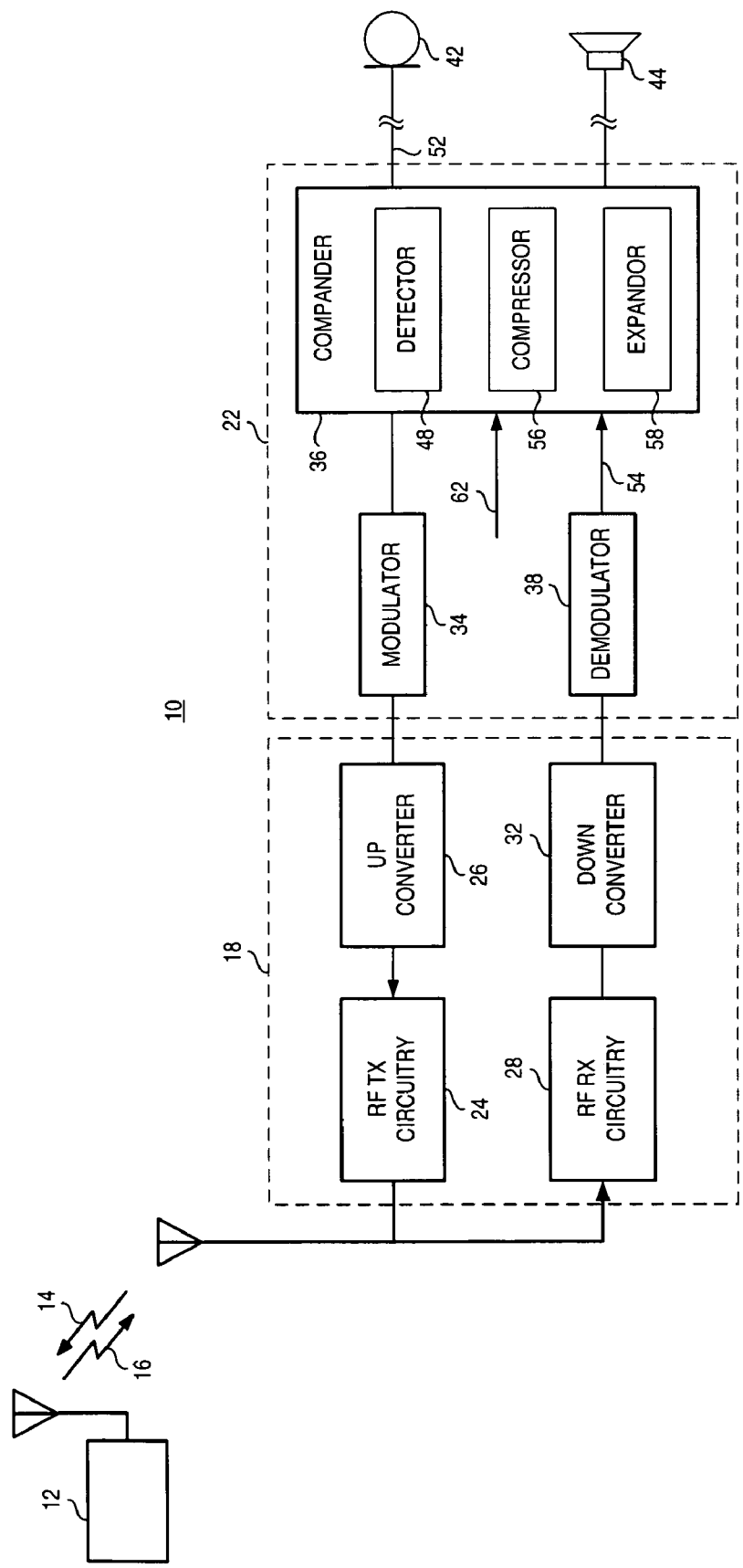
FIG. 1 illustrates a functional block diagram of a radio communication station in which an embodiment of the present invention is operable.

Referring first to FIG. 1, a radio communication station, shown generally at 10, is operable to transceive radio frequency signals. The radio communication station is operable in a two-way communication system to communicate data to and from another communication station, of which the communication station 12 is representative. Communication data originated at the communication station 10 is converted into radio frequency form, here by modulation upon a carrier wave, and communicated upon a radio channel, here indicated by the arrow 14, to the remote communication station 12. And, communication data originated at the remote communication station is communicated to the communication station 10 by way of a channel, here represented by the arrow 16. When communications are effectuated pursuant to a half-duplex communication scheme, the same radio channel is used to communicate the data in both directions. That is to say, a common channel is used to communicate data originated at the communication station 10 to the communication station 12 as that which is used to communicate data originated at the communication station 12 and communicated to the communication station 10.

The communication stations operate pursuant to a coded squelch scheme, such as a continuous tone coded squelch system (CTCSS) or digital coded squelch (DCS) scheme. And, the communication stations are operable in an unlicensed frequency band, such as at any of the aforementioned 151, 154, or 460 MHz frequency bands. Through operation of the coded squelch scheme, the communication stations communicate only with appropriate other ones of the communication stations that might be concurrently operable within the same frequency band. When the coded squelch scheme forms a continuous tone coded squelch system scheme, a specific, low-frequency, sub-audible tone is sent along with the communication data by the communication station that originates the communication data. For instance, when data originated at the communication station 10 is sent, the communication station generates the sub-audible tone along with the communication data. Another communication station, here the communication station 12, detects the signal energy of the communicated signal, and, if the communication station recognizes the tone that is sent, the communication station opens the squelch and permits the communication data transmitted by the communication station 10 to be displayed, e.g., in aural form, at the communication station 12. Communication data of only one communication station that sends the correct tone is displayed at the communication station. Multi-station arrangements are analogously operable. That is to say, communication data of additional communication stations, also identified by the correct tone, is displayed at the communication station that receives the communicated energy. In conventional CTCSS operation, the tones that are selected for communication together with other communication data are selected from a set in which none of the tones of the set are harmonics of one another.

When the coded squelch scheme is formed of a digital coded squelch scheme, a digital code is sent along with the communication data by the communication station at which the data is originated. If the communication station that detects the communicated signal recognizes the digital code, the communication station opens the squelch and permits the communication data to be displayed or otherwise played-out thereat.

The communication station 10 includes multiple stages, here a radio frequency (RF) stage or part 18 and a baseband stage or part 22. In the exemplary implementation, the communication station is of a direct conversion architecture in which the RF part is directly connected to the baseband part and signals are directly converted between RF and baseband levels. In other implementations, additional stages are provided, i.e., one or more intermediate frequency (IF) stages are provided between the RF and baseband parts.

At the RF part 18, the transmit portion of the communication station includes RF transmit circuitry 24 and up-converter circuitry 26. And, the receive portion of the RF part includes RF circuitry 28 and down-converter circuitry 32.

The receive portion of the baseband part here includes baseband circuitry, identified by a modulator 34 and a compander 36 of an embodiment of the present invention. The receive portion of the baseband part also includes baseband circuitry, here including a demodulator 38 and the compander 36. The transmit portion of the communication station also includes a transducer 42, here forming a speaker 44.

The compander 36 is positioned in line with the transmit and receive portions of the communication station, connected to receive communication data that is to be sent and that which is received, respectively, during operation of the communication station. The compander includes a detector 48 that detects communication data applied thereto, i.e., originating data applied to the compander by way of the line 52 or terminating data applied to the compander by way of the line 54 is detected by the detector. Upon detection of the data, the detector causes companding operations to be invoked. Here, the companding operations are separately identified as compacting operations and expanding operations 56 and 58, respectively. When the detector detects originating communication data on the line 52, the detector invokes the compacting operation 56 to cause the originating communication data to be placed into compacted form. And, when the detector detects terminating communication data on the line 54, the detector invokes performance of the expansion operations to expand the terminating data into expanded form.

In a further implementation, the compander includes more than one companding mechanism. That is to say, the compacting operations 56 are of two or more compacting types, and the expansion operations include two or more expanding types. When detection is made that companding operations are to be performed, further selection is made as to which of the compacting and expanding operation types, as appropriate, of operations are to be performed upon the communication data applied thereto. Here, the line 62 is representative of selection instructions applied to the compander. Selection instructions are made responsive to a desired indicia, such as communication conditions, communication capacity, manual selection, or other selection indicia.

The operations represented by the detector 48, compacting operations 56, and expanding operations 58 comprise algorithms executable by processing circuitry. Filters, required to be positioned together with conventional compander devices, are not required as the companding operations carried out by the compander 36 of an embodiment of the present invention does not generate the noise energy as a byproduct of its operation to an extent necessitating the use of additional filters.

Figure 2:
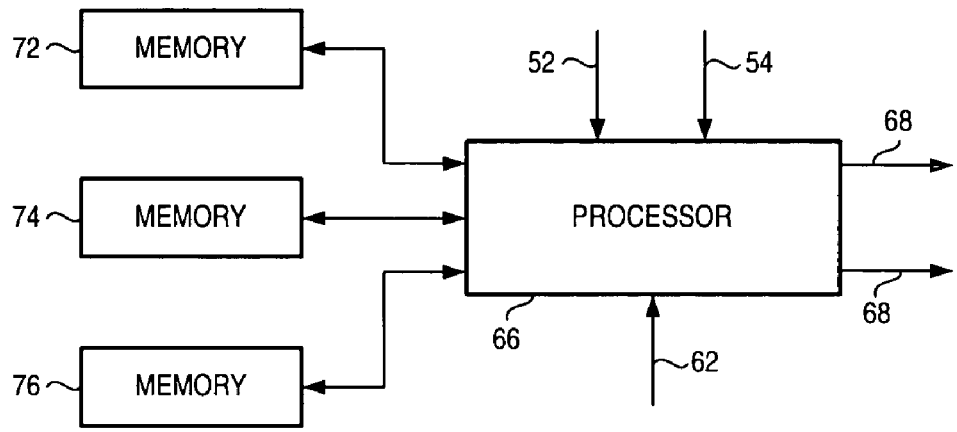
FIG. 2 illustrates a functional block diagram of an exemplary implementation of the compander of an embodiment of the present invention.

FIG. 2 illustrates the compander 36 forming a part of the communication station 10 shown in FIG. 1. The compander is here shown to include a processor 66 to which input lines 52 and 54 extend and from which output lines 68 extend. The processor is also coupled to memory elements 72, 74, and 76 to permit the processor to access content stored at the respective memories. And, the line 62 extending to the processor is representative of input of selection indicia to the processor to select a companding operation-type.

Communication data is applied to the processor 66 by way of the lines 52/54. When the communication data is originating data, the data is applied on the line 52, and when the communication data forms terminating data, the data is applied to the processor by way of the line 54. Detection is made at the processor, such as by execution of an interrupt algorithm, here represented by code stored at the memory element 72, to detect application of data on the lines 52 and 54. When detection is made, the processor invokes a selected companding operation to be performed. When the communication data forms originating data on the line 52, a compacting algorithm, here represented to be stored at the memory 74, is invoked to cause compaction of the originating data into compacted form. The originating data, once compacted, is provided on a line 68 for further transmit portion operations to be performed thereon.

When detection is made that terminating data is applied to the processor on the line 54, selected expanding operations are invoked, here retrieved from the memory 76. The expansion algorithm is executed at the processor, and the terminating data, once expanded, is generated on the line 68 for further processing at the receive portion of the radio communication station.

The processor 66 is, in one implementation, used additionally for other purposes at the radio communication station, such as other coding and decoding operations at the baseband part of the radio communication station at which the compander is embodied.

Figure 3:
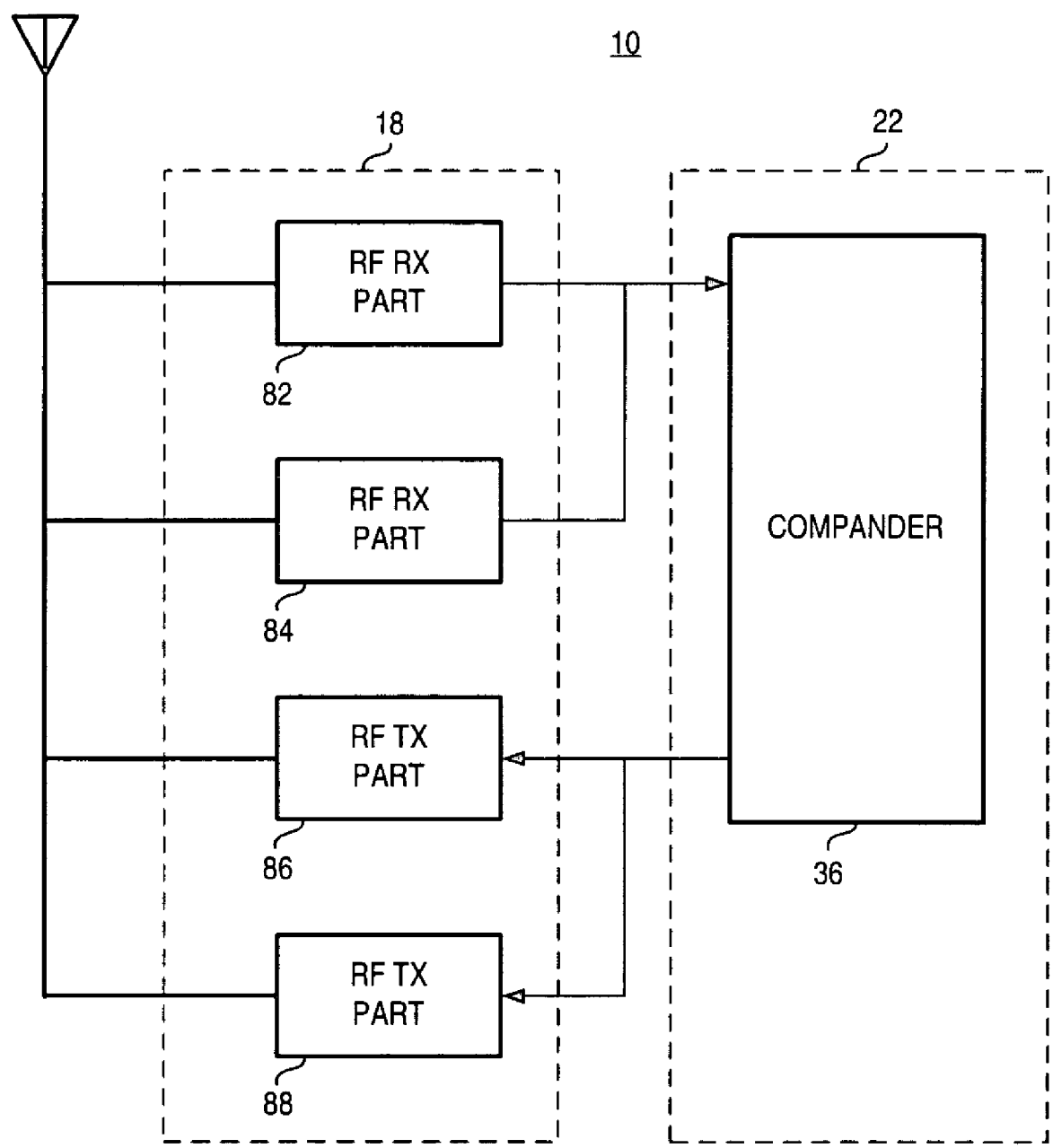
FIG. 3 illustrates a functional block diagram of a radio communication station, similar to the one shown in FIG. 1, but here of a multi-mode radio that includes an embodiment of the present invention as a portion thereof.

FIG. 3 illustrates a radio communication station 10 of another implementation. Here, the communication station forms a multi-mode device, capable of operations selectably to provide for the communication of data pursuant to a selected one of two or more personal communication services. The multi-mode radio communication station shown in FIG. 3 is selectably operable as a MURS radio and as a FRS radio. That is to say, in the embodiment shown in FIG. 3, the communication station forms a dual-mode radio, capable of operation in a MURS mode and in a FRS mode.

Again, the baseband part 22 of the communication station again includes a compander 36 in line as part of the transmit and receive portions of the communication station. The compander operates as described previously with respect to the implementations shown in FIGS. 1 and 2.

The radio frequency part 18 of the communication station here includes separate receive portions 82 and 84 and separate transmit portions 86 and 88. The separate receive parts 82 and 84 and separate transmit parts 86 and 88 form MURS and FRS radio stages, respectively. That is to say, the parts 82 and 86 form MURS radio stages and the parts 84 and 88 form FRS radio parts. When the communication station is operated as an MURS radio, the radio parts 82 and 86 are operable, and when the communication station is operated as an FRS radio, the parts 84 and 88 are operable. The compander, implemented as a processor having expansion and compaction algorithms executable thereat perform the companding operations, free of the need to use separate filter elements to filter noise generated as a byproduct of its operation.

Figure 4:
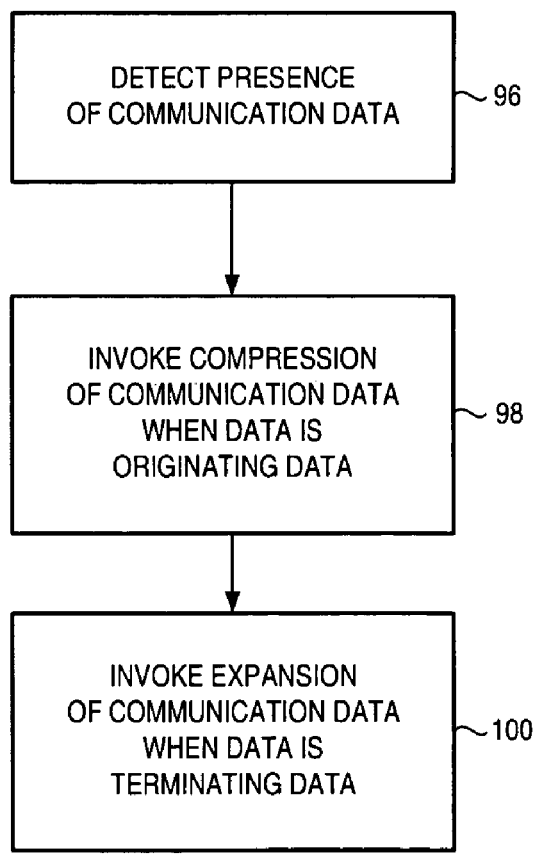
FIG. 4 illustrates a method flow diagram listing the method of operation of an embodiment of the present invention.

FIG. 4 illustrates a method flow diagram, shown generally at 92, representative of the method of operation of an embodiment of the present invention. The method is for a two-way radio communication station that operates pursuant to a coded squelch system to initiate communication of communication data. First, and as indicated by the block 96, the presence of communication data generated for communication pursuant to operation of the radio communication station is detected.

Then, and as indicated by the block 98, compression of the communication data is invoked when the communication data comprises originating data to be sent by the radio communication station. Otherwise, and as indicated by the block 100, expansion of the communication data is invoked when the communication data comprises terminating data.

Through the implementation of companding in a two-way radio operable pursuant to the coded squelch scheme in which a processor is utilized to perform the companding operations, improved communications are provided.

The previous descriptions are of preferred examples for implementing the invention, and the scope of the invention should not necessarily be limited by this description. The scope of the present invention is defined by the following claims.

What is claimed is:

1. A computer program product for a two-way radio communication station that operates pursuant to a coded squelch scheme in a first coded-squelch mode and in a second coded-squelch mode to initiate communication of communication data, said computer program product comprising:
   a computer useable storage medium;
   computer readable code embodied in the storage medium for compressing communication data originated at the two-way radio by any of a first compacting type and a second compacting type the communication data compressed by the first compacting type when the communication station is operated in the first coded-squelch mode and the communication data compressed by the second compacting type when the communication station is operable in the second coded-squelch mode;
   computer readable code embodied in the storage medium for expanding communication data terminated at the two-way radio by any of a first expanding operation type and a second expanding operation type the communication data expanded by the first expanding operation type when the communication station is operated in the first coded-squelch mode and the communication data expanded by the second expanding operation type when the communication station is operated in the second coded-squelch mode.

2. The computer program product of claim 1 wherein said computer readable code for compressing and said computer readable code for expanding together form computer readable code for companding the communication data.

3. The computer program product of claim 1 wherein the two-way radio comprises a baseband part and wherein said computer useable storage medium together with said computer readable code for compressing and said computer readable code for expanding are maintained at the baseband part.

4. The computer program product of claim 3 wherein the two way radio communication station comprises an FRS (Family Radio Service) radio and wherein said computer useable storage medium together with said computer readable code for compressing and said computer readable code for expanding are maintained at the baseband part of the FRS radio.

5. The computer program product of claim 3 wherein the two way radio communication station comprises a multi mode FRS (Family Radio Service) and MURS (Multi User Radio Service) radio and wherein said computer useable storage medium together with said computer readable code for compressing and said computer readable code for expanding are maintained at the baseband part of the multi-mode FRS and MURS radio.

6. The computer program product of claim 1 further comprising a computer readable code device configured to detect originating data to be sent by the two-way radio and to invoke execution of the computer readable code for compressing the communication data, the originating data comprising the communication data.

7. The computer program product of claim 1 further comprising a computer readable code device configured to detect terminating data delivered to the two-way radio and to invoke execution of the computer readable code for expanding the communication data, the terminating data comprising the communication data.

8. Apparatus for a two-way radio communication station that operates pursuant to a coded squelch scheme in a first coded-squelch mode and in a second coded-squelch mode to initiate communication of communication data, said apparatus comprising:
    a processor embodied at the radio communication station;
    a detector executable at said processor for detecting presence of the communication data communicated pursuant to operation of the radio communication station; and
    an invoker executable at said processor responsive to detection by said detector of the communication data, said invoker for invoking compression of the communication data by a selected one of a first compacting type and a second compacting type when the communication data comprises originating data to be sent by the radio communication station selection of which compacting type to invoke responsive to a selection indicia and for invoking expansion by a selected one of a first expanding operation type and a second expanding operation type of the communication data when the communication data comprises terminating data selection of which expanding type to invoke responsive to a selection indicia the communication data compressed by the first compacting type when the communication station is operated in the first coded-squelch mode and the communication data compressed by the second compacting type when the communication station is operated in the second coded-squelch mode, and the communication data expanded by the first expanding operation type when the communication station is operated in the first coded squelch mode and the communication data expanded by the second expanding operation type when the communication station is operated in the second coded-squelch mode.

9. The apparatus of claim 8 wherein the two-way radio communication station comprises a baseband part and wherein said processor, said detector, and said invoker are embodied at the baseband part.

10. The apparatus of claim 9 wherein the two way radio communication station comprises an FRS (Family Radio Service) radio and wherein said processor, said detector, and said invoker are embodied at the baseband part of the radio.

11. The apparatus of claim 9 wherein the two way radio communication station comprises a multi mode FRS Family Radio Service and MURS (Multi User Radio Service) radio and wherein said processor, said detector, and said invoker are embodied at the baseband part of the multi-mode FRS and MURS radio.

12. The apparatus of claim 8 wherein said invoker invokes companding of the communication data upon detection by said detector of the communication data, the companding for compressing the communication data when the communication data comprises the originating data and the companding for expanding the communication data when the communication data comprises the terminating data.

13. A method for a dual mode, two-way radio communication station, operable in at least both the Family Radio Service (FRS) band and the Multi-User Radio Service (MURS) band, and which operates pursuant to a coded squelch scheme in a first coded-squelch mode and in a second coded-squelch mode to initiate communication of communication data, said method comprising the operations of:
    detecting the presence of communication data generated for communication pursuant to operation of the radio communication station;
    invoking compression of the communication data by a selected one of a first compacting type and a second compacting type when the communication data detected during said operation of detecting comprises originating data to be sent by the radio communication system, selection of which of the first and second compacting types responsive to in which of the FRS band and the MURS band that the two-way radio communication station is operated the communication data compressed by the first compacting type when the communication station is operated in the first coded-squelch mode and the communication data compressed by the second compacting type when the communication station is operated in the second coded-squelch; and
    invoking expansion of the communication data by a selected one of a first expanding operation type and a second expanding operation type when the communication data detected during said operation of detecting comprises terminating data, selection of which of the first and second expanding operation types responsive to in which of the FRS band and the MURS band that the two-way radio communication station is operated, the communication data expanded by the first expanding operation type when the communication station is operated in the first coded-squelch mode and the communication data expanded by the second expanding operation type when the communication station is operated in the second coded-squelch mode.

14. The method of claim 13 wherein said operation of detecting comprises executing a detection interrupt at a baseband processor of the two-way radio.

15. The method of claim 14 further comprising the operations, prior to said operation of detecting, of sourcing the communication data at the radio communication station and delivering the communication data to the baseband processor.

16. The method of claim 14 further comprising the operations, prior to said operation of detecting, of sending the communication data to the radio communication station and delivering the communication data to the baseband processor.

17. The method of claim 13 wherein said operations of invoking further comprise determining whether the communication data detected during said operation of detecting comprises originating data or terminating data.

18. The method of claim 13 wherein the compression and the expansion invoked during said first and second operations of invoking, respectively, are performed by execution of a compander at a baseband processor.

* * * * *